(12) United States Patent
Lee

(10) Patent No.: US 9,087,776 B2
(45) Date of Patent: Jul. 21, 2015

(54) NITRIDE-BASED SEMICONDUCTOR DEVICE AND METHOD OF MANUFACTURING NITRIDE-BASED SEMICONDUCTOR DEVICE

(71) Applicant: SAMSUNG ELECTRONICS CO., LTD., Suwon-si, Gyeonggi-do (KR)

(72) Inventor: Jae Hoon Lee, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/945,613

(22) Filed: Jul. 18, 2013

(65) Prior Publication Data

US 2014/0021488 A1    Jan. 23, 2014

(30) Foreign Application Priority Data

Jul. 20, 2012    (KR) .................. 10-2012-0079360

(51) Int. Cl.
| | |
|---|---|
| *H01L 29/267* | (2006.01) |
| *H01L 29/26* | (2006.01) |
| *H01L 29/423* | (2006.01) |
| *H01L 29/66* | (2006.01) |
| *H01L 29/778* | (2006.01) |
| *H01L 29/06* | (2006.01) |
| *H01L 29/20* | (2006.01) |
| *H01L 21/02* | (2006.01) |

(52) U.S. Cl.
CPC .......... *H01L 29/267* (2013.01); *H01L 29/0657* (2013.01); *H01L 29/2003* (2013.01); *H01L 29/26* (2013.01); *H01L 29/42316* (2013.01); *H01L 29/66462* (2013.01); *H01L 29/7787* (2013.01); *H01L 21/0237* (2013.01); *H01L 21/02447* (2013.01); *H01L 21/02458* (2013.01); *H01L 21/02505* (2013.01); *H01L 21/02521* (2013.01); *H01L 21/02529* (2013.01)

(58) Field of Classification Search
USPC ........................................... 257/77
See application file for complete search history.

(56) References Cited

U.S. PATENT DOCUMENTS

| | | | |
|---|---|---|---|
| 7,230,284 B2 | 6/2007 | Parikh et al. | |
| 2003/0020092 A1* | 1/2003 | Parikh et al. ................... | 257/192 |
| 2005/0059204 A1* | 3/2005 | Heschel ........................ | 438/222 |
| 2006/0081985 A1 | 4/2006 | Beach et al. | |
| 2007/0210332 A1 | 9/2007 | Ueno et al. | |
| 2007/0278518 A1 | 12/2007 | Chen et al. | |
| 2008/0283865 A1* | 11/2008 | Yoo et al. ....................... | 257/103 |
| 2010/0176421 A1* | 7/2010 | Van Hove et al. ............. | 257/194 |
| 2011/0114968 A1* | 5/2011 | Sheppard et al. ............... | 257/77 |

* cited by examiner

*Primary Examiner* — Zandra Smith
*Assistant Examiner* — Lawrence Tynes, Jr.
(74) *Attorney, Agent, or Firm* — McDermott Will & Emery LLP

(57) ABSTRACT

In a nitride-based semiconductor device, an undoped gallium nitride (GaN) layer is formed on an aluminum gallium nitride (AlGaN) layer, and a silicon carbon nitride ($Si_xC_{1-x}N$) functional layer is formed on the undoped GaN layer.

20 Claims, 10 Drawing Sheets

NITRIDE-BASED SEMICONDUCTOR DEVICE AND METHOD OF MANUFACTURING NITRIDE-BASED SEMICONDUCTOR DEVICE

CROSS-REFERENCE TO RELATED APPLICATION

This application claims the benefit of Korean Patent Application No. 10-2012-0079360, filed on Jul. 20, 2012, in the Korean Intellectual Property Office, the disclosure of which is incorporated herein by reference in its entirety.

BACKGROUND

1. Field of the Present Inventive Concept

The present inventive concept relates to a nitride-based semiconductor device and a method of manufacturing the nitride-based semiconductor device, and more particularly, to a nitride-based semiconductor device and a method of manufacturing the nitride-based semiconductor device that improves surface roughness of an aluminum gallium nitride (AlGaN) layer and that reduces leakage current.

2. Description of the Related Art

As information communication technologies have been considerably developed globally, communication technologies for high-speed and large-capacity signal communication have been rapidly developed. In particular, due to an increase in demands for personal mobile phones, satellite communication, military radar, broadcasting communication, communication relay, and the like in wireless communication technologies, demands for a high-speed and a high-power electronic device for high-speed information communication systems of microwave and millimeter-wave bands have increased. Consequently, a large number of research on a power device used in a high-power electronic device is being conducted to reduce energy loss.

In particular, since a gallium nitride (GaN)-based nitride semiconductor has advantageous properties, such as a high energy gap, a high thermal stability, a high chemical stability, a high electronic saturation velocity of about $3 \times 10^7$ centimeters per second (cm/sec), and the like, the GaN-based nitride semiconductor may be readily utilized as an optical device, and a high-frequency and high-power electronic device. Accordingly, researches on the GaN-based nitride semiconductor are being actively conducted all over the world.

An electronic device based on the GaN-based nitride semiconductor may have various advantages, such as a high breakdown field of about $3 \times 10^6$ volts per centimeter (V/cm), a maximum current density, a stable high temperature operation, a high thermal conductivity, and the like. A heterostructure field effect transistor (HFET) formed from a heterojunction of aluminum gallium nitride (AlGaN) and GaN has a high band-discontinuity at a junction interface, whereby a high-density of electrons may be freed at the interface and thus, an electron mobility may increase. Accordingly, the HFET may be applicable as the high-power device.

However, a structure of an AlGaN/GaN HFET with a high electron mobility may have a disadvantage in that leakage current flowing along a surface may decrease a device property, due to an unstable AlGaN surface.

SUMMARY

An aspect of the present inventive concept provides a nitride-based semiconductor device and a method of manufacturing the nitride-based semiconductor device that improves surface roughness of an aluminum gallium nitride (AlGaN) layer and reduces leakage current.

According to an aspect of the present inventive concept, there is provided a nitride-based semiconductor device including a substrate, a semi-insulating gallium nitride (GaN) layer disposed on the substrate, an AlGaN layer disposed on the semi-insulating GaN layer, an undoped GaN layer disposed on the AlGaN layer, a silicon carbon nitride ($Si_xC_{1-x}N$) functional layer disposed on the undoped GaN layer, and a first silicon nitride ($SiN_x$) layer disposed on the $Si_xC_{1-x}N$ functional layer.

In an embodiment, the nitride-based semiconductor device of the present disclosure further includes a low temperature silicon carbide (SiC) layer or a GaN layer disposed between the substrate and the semi-insulating GaN layer.

In another embodiment, the nitride-based semiconductor device of the present disclosure further includes a second $SiN_x$ layer disposed on the first $SiN_x$ layer.

In another embodiment, in the $Si_xC_{1-x}N$ functional layer, x has a value in a range of $0<x<1$.

In another embodiment, the $Si_xC_{1-x}N$ functional layer includes monocrystalline $Si_xC_{1-x}N$, polycrystalline $Si_xC_{1-x}N$, or amorphous $Si_xC_{1-x}N$.

In another embodiment, the $Si_xC_{1-x}N$ functional layer has a thickness of 1 nanometers (nm) to 50 nm.

In another embodiment, the undoped GaN layer has a thickness of 1 nm to 50 nm.

In another embodiment, the first $SiN_x$ layer has a thickness of 1 nm to 50 nm.

In another embodiment, the second $SiN_x$ layer has a thickness of 1 nm to 500 nm.

In another embodiment, the AlGaN layer includes a two-dimensional electron gas (2DEG) layer disposed in the AlGaN layer.

In another embodiment, the nitride-based semiconductor device further includes a gate electrode disposed on the second $SiN_x$ layer, a source electrode disposed on the $Si_xC_{1-x}N$ functional layer, the source electrode being exposed through a first area of the $Si_xC_{1-x}N$ functional layer, and a drain electrode disposed on the $Si_xC_{1-x}N$ functional layer, the drain electrode being exposed through a second area of the $Si_xC_{1-x}N$ functional layer.

In another embodiment, the nitride-based semiconductor device further includes an ohmic electrode disposed on the $Si_xC_{1-x}N$ functional layer, the ohmic electrode being exposed through a first area of the $Si_xC_{1-x}N$ functional layer, and a Schottky electrode disposed on the $Si_xC_{1-x}N$ functional layer, the Schottky electrode being exposed through a second area of the $Si_xC_{1-x}N$ functional layer.

In another embodiment, the semi-insulating GaN layer is exposed by a trench extending along a portion of the semi-insulating GaN layer, the AlGaN layer, the undoped GaN layer, the $Si_xC_{1-x}N$ functional layer, and the first $SiN_x$ layer.

In another embodiment, the nitride-based semiconductor device further includes an insulating layer disposed along an inner surface of the trench.

In another embodiment, the insulating layer is a gate insulating layer. In an embodiment, the nitride-based semiconductor device further includes a gate electrode disposed on the gate insulating layer, a source electrode disposed on the $Si_xC_{1-x}N$ functional layer, the source electrode being exposed through a first area of the $Si_xC_{1-x}N$ functional layer, and a drain electrode disposed on the $Si_xC_{1-x}N$ functional layer, the drain electrode being exposed through a second area of the $Si_xC_{1-x}N$ functional layer.

In another embodiment, the nitride-based semiconductor device further includes an ohmic electrode disposed on the $Si_xC_{1-x}N$ functional layer, the ohmic electrode being exposed through a first area of the $Si_xC_{1-x}N$ functional layer, and a Schottky electrode disposed on the $Si_xC_{1-x}N$ functional layer, the Schottky electrode being exposed through a second area of the $Si_xC_{1-x}N$ functional layer.

According to another aspect of the present inventive concept, there is provided a method of manufacturing the nitride-based semiconductor device, the method including forming a semi-insulating GaN layer on a substrate, forming an AlGaN layer on the semi-insulating GaN layer, forming an undoped GaN layer on the AlGaN layer, forming a $Si_xC_{1-x}N$ functional layer on the undoped GaN layer, and forming a first $SiN_x$ layer on the $Si_xC_{1-x}N$ functional layer.

In an embodiment, the forming of the $Si_xC_{1-x}N$ functional layer includes using tetrabromomethane ($CBr_4$) as a source of carbon (C), using ditertiarybutyl silane (DTBSi) as a source of silicon (Si), and using ammonia ($NH_3$) as a source of nitrogen (N).

In another embodiment, the $SiC_{1-x}N$ functional layer and the first $SiN_x$ layer is formed through an in-situ process by metal organic chemical vapor deposition (MOCVD).

In another embodiment, the method further includes forming a second $SiN_x$ layer on the first $SiN_x$ layer, wherein the second $SiN_x$ layer is formed by using low pressure chemical vapor deposition (LPCVD).

BRIEF DESCRIPTION OF THE DRAWINGS

These and/or other aspects, features, and advantages of the present inventive concept will become apparent and more readily appreciated from the following description of exemplary embodiments, taken in conjunction with the accompanying drawings of which.

DETAILED DESCRIPTION

Figure 1:
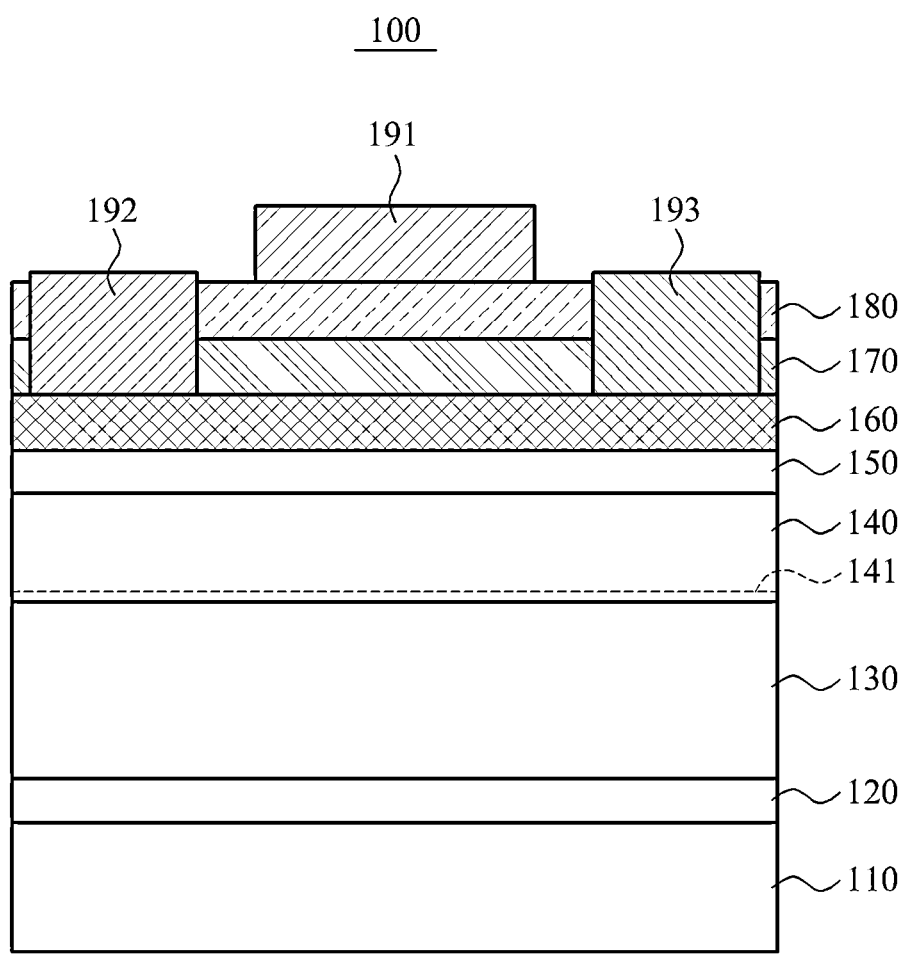
FIG. 1 is a cross-sectional diagram illustrating a structure of a nitride-based semiconductor device according to an embodiment of the present inventive concept.

Reference will now be made in detail to exemplary embodiments of the present inventive concept, examples of which are illustrated in the accompanying drawings, wherein like reference numerals may refer to like elements throughout. Exemplary embodiments are described below to explain the present inventive concept by referring to the figures.

Throughout the specification, when it describes that each of a layer, a side, a chip, and the like is formed "on" or "under" a layer, a side, a chip, and the like, the term "on" may include "directly on" and "indirectly on by interposing another element therebetween," and the term "under" may include "directly under" and "indirectly under by interposing another element therebetween." A non-limiting example for "on" or "under" of each element may be determined based on a corresponding drawing.

The size of each element in the drawings may be exaggerated for ease of description, and may not indicate the actual size of the element.

Hereinafter, embodiments of the present inventive concept will be described in detail with reference to the accompanying drawings. However, the present inventive concept is not limited to the embodiments described.

FIG. 1 is a cross-sectional diagram illustrating a structure of a nitride-based semiconductor device 100 according to an embodiment of the present inventive concept. In an embodiment, the nitride-based semiconductor device 100 of FIG. 1 is a normally-on heterostructure field effect transistor (HFET).

Referring to FIG. 1, the nitride-based semiconductor device 100 includes a substrate 110, a semi-insulating gallium nitride (GaN) layer 130 formed on the substrate 110, an aluminum gallium nitride (AlGaN) layer 140 formed on the semi-insulating GaN layer 130, an undoped GaN layer 150 formed on the AlGaN layer 140, a silicon carbon nitride ($Si_xC_{1-x}N$) functional layer 160 formed on the undoped GaN layer 150, and a first silicon nitride ($SiN_x$) layer 170 formed on the $SiC_{1-x}N$ functional layer 160. Additionally, the nitride-based semiconductor device 100 may further include a buffer layer 120 formed between the substrate 110 and the semi-insulating GaN layer 130. The buffer layer 120 may be, for example, a low temperature silicon carbide (SiC) layer or a GaN layer.

The substrate 110 is formed of various materials, based on a thermal expansion coefficient, a lattice constant and the like of a nitride-based semiconductor layer, such as the semi-insulating GaN layer 130 and the AlGaN layer 140. The substrate 110 includes an insulating substrate, for example a sapphire substrate or a magnesium aluminum sulfate ($MgAl_2SO_4$) substrate having a spinel structure, and may be formed of at least one material selected from the group consisting of GaN, gallium arsenide (GaAs), SiC, silicon (Si), zinc oxide (ZnO), zirconium diboride ($ZrB_2$), gallium phosphide (GaP), and diamond, but there is no limitation thereto.

In an embodiment, the buffer layer 120 is formed on the substrate 110. The buffer layer 120 may include a complex of $Si_xC_{1-x}N$ and GaN, and may be, for example, a low temperature-SiC layer or a GaN layer. The buffer layer 120 enhances stability of an HFET by minimizing a difference in a thermal expansion coefficient, a lattice constant and the like of a nitride-based semiconductor layer, such as the semi-insulating GaN layer 130 and the AlGaN layer 140.

The semi-insulating GaN layer 130 may be formed on the buffer layer 120. The semi-insulating GaN layer 130 prevents leakage current from flowing toward the substrate 110, and has a relatively high resistance for separation of devices. The semi-insulating GaN layer 130 exhibits semi-insulating properties due to an extremely high resistance.

The AlGaN layer 140 is formed on the semi-insulating GaN layer 130. The AlGaN layer 140 acts as a channel layer. For example, the AlGaN layer 140 may act as a channel layer enabling current to flow, since a two-dimensional electron gas (2-DEG) layer 141 is formed on the AlGaN layer 140 due to a difference in band-gap energy between the AlGaN layer 140 and the undoped GaN layer 150.

For example, when an extremely thin AlGaN layer 140 is formed, a thin 2-DEG layer 141 is formed due to a low piezo effect. Conversely, when an extremely thick AlGaN layer 140 is formed, a density of the 2-DEG layer 141 is reduced due to a loss of a piezo effect. To obtain a maximum piezo effect, the AlGaN layer 140 has a thickness of 1 nanometers (nm) to 50 nm, or a thickness of 20 nm to 30 nm.

The undoped GaN layer 150 is formed on the AlGaN layer 140. The undoped GaN layer 150 refers to a GaN layer that is undoped with impurities, and that prevents current from leaking from a surface of the AlGaN layer 140. Additionally, since the undoped GaN layer 150 is formed on the AlGaN layer 140, the undoped GaN layer 150 prevents the surface of the AlGaN layer 140 from being oxidized by oxygen (O), and improves surface roughness. In the nitride-based semiconductor device 100, the undoped GaN layer 150 has a thickness of 1 nm to 50 nm.

The $Si_xC_{1-x}N$ functional layer 160, where $0<x<1$, is formed on the undoped GaN layer 150. In the $Si_xC_{1-x}N$ functional layer 160, Si and carbon (C) may be combined in a predetermined ratio, and a ratio of Si and C may be adjusted properly. The $Si_xC_{1-x}N$ functional layer 160 improves surface roughness by protecting the surface of the AlGaN layer 140, and blocks surface leakage current of the AlGaN layer 140 (i.e., prevents current from leaking from the surface of the AlGaN layer 140).

$Si_xC_{1-x}N$ in the $Si_xC_{1-x}N$ functional layer 160 may be manufactured using a material having various crystalline phases, to block the surface leakage current of the AlGaN layer 140 (i.e., to prevent current from leaking from the surface of the AlGaN layer 140, and to enable a smooth current flow between the AlGaN layer 140, an ohmic metal, and the like). The $Si_xC_{1-x}N$ in the $Si_xC_{1-x}N$ functional layer 160 may include, for example, monocrystalline $Si_xC_{1-x}N$, polycrystalline $Si_xC_{1-x}N$, or amorphous $Si_xC_{1-x}N$. Additionally, in the nitride-based semiconductor device 100, the $Si_xC_{1-x}N$ functional layer 160 has a thickness of 1 nm to 50 nm.

In the nitride-based semiconductor device 100 according to an embodiment of the present inventive concept, the $Si_xC_{1-x}N$ functional layer 160 is formed on the AlGaN layer 140 and the undoped GaN layer 150, and thus it is possible to improve the surface roughness of the AlGaN layer 140, and to reduce surface leakage current, by inhibiting aluminum (Al) and O from combining with each other on the surface of the AlGaN layer 140.

Additionally, in comparison to a structure in which an AlGaN layer is in direct contact with an electrode, a structure according to embodiments of the present inventive concept in which a $Si_xC_{1-x}N$ functional layer is formed between an AlGaN layer and an electrode may have a low barrier. However, in the structure according to embodiments of the present inventive concept, operating voltage may be lowered to increase a current density.

The first $SiN_x$ layer 170 is formed on the $Si_xC_{1-x}N$ functional layer 160. The first $SiN_x$ layer 170 functions to protect the $Si_xC_{1-x}N$ functional layer 160. For example, the first $SiN_x$ layer 170 may be used to protect a surface of the $Si_xC_{1-x}N$ functional layer 160. In the nitride-based semiconductor device 100, the first $SiN_x$ layer 170 has a thickness of 1 nm to 50 nm.

Additionally, a second $SiN_x$ layer 180 may be formed on the first $SiN_x$ layer 170. The second $SiN_x$ layer 180 may be used to protect the surface of the $SiC_{1-x}N$ functional layer 160, and a surface of the first $SiN_x$ layer 170. In the nitride-based semiconductor device 100, the second $SiN_x$ layer 180 has a thickness of 1 nm to 500 nm. The second $SiN_x$ layer 180 and the first $SiN_x$ layer 170 may be formed using different schemes, which will be further described later.

The first $SiN_x$ layer 170 and the second $SiN_x$ layer 180, as passivation thin films, reduce instability of the surface of the $SiC_{1-x}N$ functional layer 160, and prevent a power characteristic from being reduced due to a current collapse phenomenon during an operation at a high frequency.

A gate electrode 191 is formed on the second $SiN_x$ layer 180.

A source electrode 192 is formed on the $Si_xC_{1-x}N$ functional layer 160, and may be exposed through a first area of the $Si_xC_{1-x}N$ functional layer 160. A drain electrode 193 is formed on the $Si_xC_{1-x}N$ functional layer 160, and may be exposed through a second area of the $Si_xC_{1-x}N$ functional layer 160.

Therefore, an HFET, according to an aspect of the present inventive concept, includes the $Si_xC_{1-x}N$ functional layer 160 formed on the AlGaN layer 140, and accordingly the roughness of a top surface of the HFET is enhanced. Additionally, due to the $Si_xC_{1-x}N$ functional layer 160, dangling bonding is prevented, and leakage current is blocked. In addition, in junction with an ohmic metal to form a source electrode and a drain electrode, the current density is increased by lowering a barrier, and thus an efficiency of an electronic device is maximized.

Figure 2:
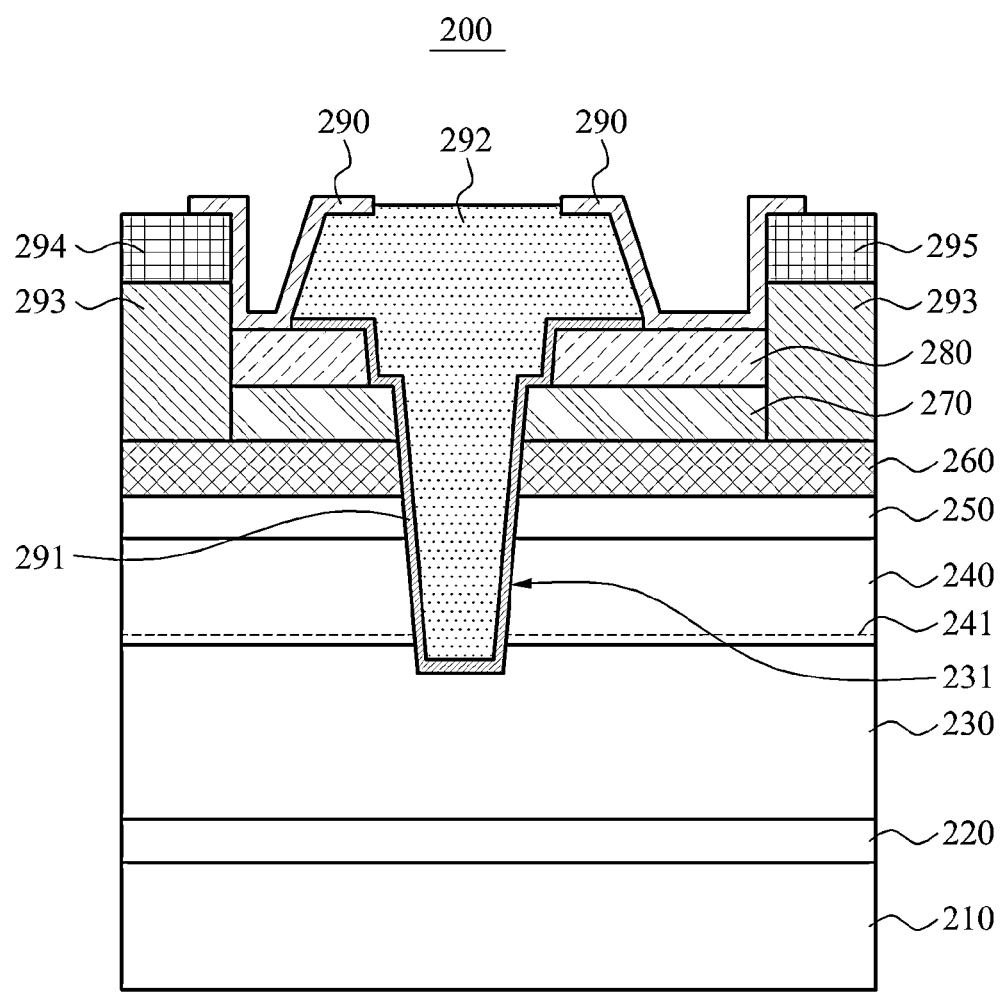
FIG. 2 is a cross-sectional diagram illustrating a structure of a nitride-based semiconductor device according to another embodiment of the present inventive concept.

FIG. 2 is a cross-sectional diagram illustrating a structure of a nitride-based semiconductor device 200, according to another embodiment of the present inventive concept. The nitride-based semiconductor device 200 of FIG. 2 is a normally-on HFET.

Referring to FIG. 2, the nitride-based semiconductor device 200 includes a substrate 210, a semi-insulating GaN layer 230 formed on the substrate 210, an AlGaN layer 240 formed on the semi-insulating GaN layer 230, an undoped GaN layer 250 formed on the AlGaN layer 240, a $Si_xC_{1-x}N$ functional layer 260 formed on the undoped GaN layer 250, and a first $SiN_x$ layer 270 formed on the $Si_xC_{1-x}N$ functional layer 260.

The nitride-based semiconductor device 200 may further include a buffer layer 220 formed between the substrate 210 and the semi-insulating GaN layer 230. The buffer layer 220 may be, for example, a low temperature SiC layer or a GaN layer.

The semi-insulating GaN layer 230 may be exposed by a trench 231. Specifically, the trench 231 is formed by etching a portion of the semi-insulating GaN layer 230, the AlGaN layer 240, the undoped GaN layer 250, the $Si_xC_{1-x}N$ functional layer 260, and the first $SiN_x$ layer 270.

An insulating layer 291 may be formed along an inner surface of the trench 231. When a second $SiN_x$ layer 280 is formed on the first $SiN_x$ layer 270, as shown in FIG. 2, the insulating layer 291 may extend to an upper area of the second $SiN_x$ layer 280, along the inner surface of the trench 231.

Additionally, the insulating layer 291 may be a gate insulating layer, and a gate electrode 292 may be formed on the insulating layer 291.

A 2-DEG layer 241 may be formed in the AlGaN layer 240. The 2-DEG layer 241 is formed due to a difference in band-gap energy between the AlGaN layer 240 and the undoped GaN layer 250. The 2-DEG layer 241 acts as a channel layer enabling current to flow.

In FIG. 2, the 2-DEG layer 241 formed in the AlGaN layer 240 may be divided by the trench 231. Since the 2-DEG layer 241 is not formed in a gate area due to the trench 231, the nitride-based semiconductor device 200 may easily perform a normally-off type operation.

To form a source electrode 294 and a drain electrode 295, a first area and a second area of the $Si_xC_{1-x}N$ functional layer 260 may be exposed. The first area and the second area may be exposed by etching a portion of the first $SiN_x$ layer 270 and a portion of the second $SiN_x$ layer 280.

The source electrode 294 may be formed on the first area of the $Si_xC_{1-x}N$ functional layer 260. As shown in FIG. 2, an ohmic metal layer 293 may be further formed on the $Si_xC_{1-x}N$ functional layer 260, and the source electrode 294 may be formed on the ohmic metal layer 293.

The drain electrode 295 may be formed on the second area of the $Si_xC_{1-x}N$ functional layer 260. As shown in FIG. 2, an ohmic metal layer 293 may be further formed on the $Si_xC_{1-x}N$ functional layer 260, and the drain electrode 295 may be formed on the ohmic metal layer 293.

The gate electrode 291, the source electrode 294 and the drain electrode 295 may be selected from (or formed of a material selected from) the group consisting of nickel (Ni), Al, titanium (Ti), titanium nitride (TiN), platinum (Pt), gold (Au), ruthenium dioxide ($RuO_2$), vanadium (V), tungsten (W), tungsten nitride (WN), hafnium (Hf), hafnium nitride (HfN), molybdenum (Mo), nickel silicide (NiSi), cobalt disilicide ($CoSi_2$), tungsten silicide (WSi), platinum silicide (PtSi), iridium (Ir), zirconium (Zr), tantalum (Ta), tantalum nitride (TaN), copper (Cu), ruthenium (Ru), and cobalt (Co), and a combination thereof.

Passivation layers 290 may be formed on the second $SiN_x$ layer 280 exposed between the gate electrode 292 and the source electrode 294, and on the second $SiN_x$ layer 280 exposed between the gate electrode 292 and the drain electrode 295.

Figure 3:
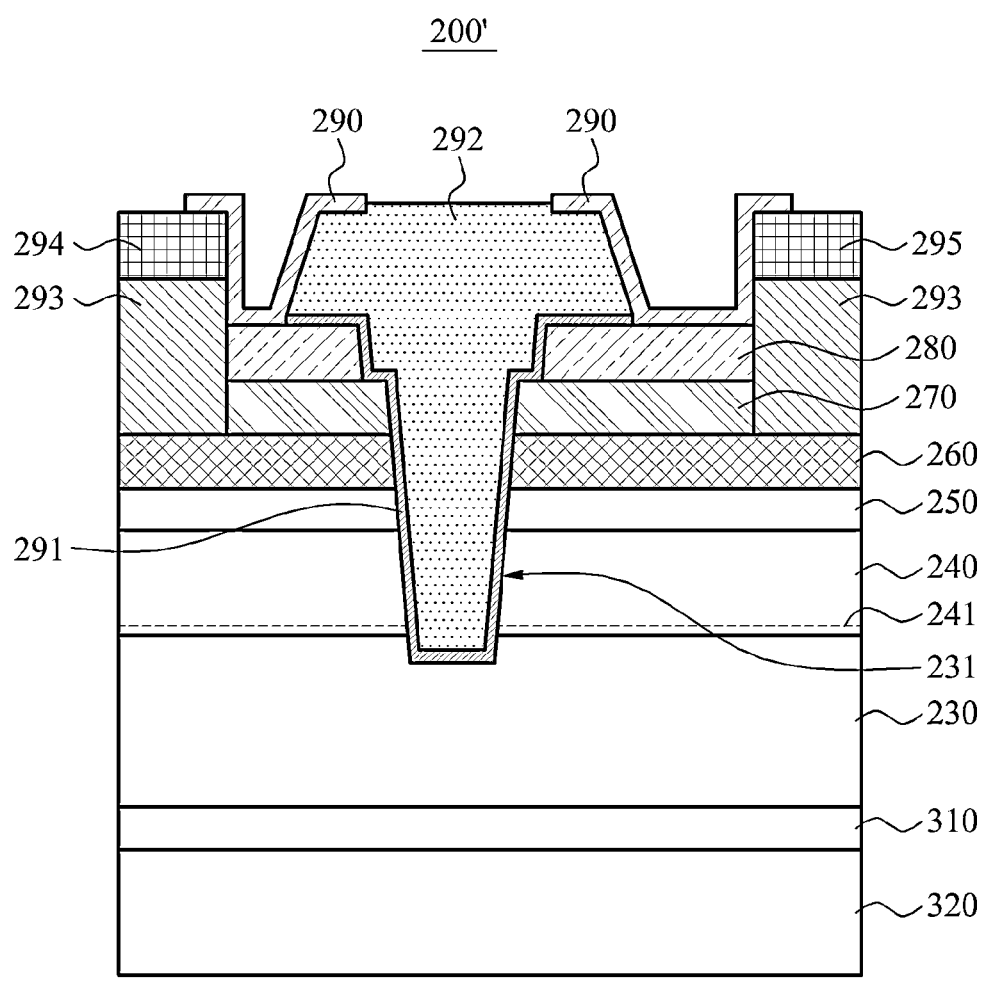
FIG. 3 is a cross-sectional diagram illustrating a structure of a nitride-based semiconductor device according to still another embodiment of the present inventive concept.

FIG. 3 is a cross-sectional diagram illustrating a structure of a nitride-based semiconductor device 200', according to another embodiment of the present inventive concept. The nitride-based semiconductor device 200' of FIG. 3 may be configured by changing a portion of the structure of the nitride-based semiconductor device 200 of FIG. 2.

Specifically, the nitride-based semiconductor device 200' includes a junction layer 310 and a thermal conductive substrate 320, instead of including a substrate and a buffer layer, in comparison to the nitride-based semiconductor device 200.

Based on a method of manufacturing a nitride-based semiconductor device, a buffer layer 220, a semi-insulating GaN layer 230, and an AlGaN layer 240 is sequentially formed on a substrate 210 having insulating properties, for example a sapphire substrate, and the substrate 210 and the buffer layer 220 is removed through a laser lift-off process. The semi-insulating GaN layer 230 is exposed by the laser lift-off process, and is connected to the thermal conductive substrate 320, using the junction layer 310.

The junction layer 310 is disposed between the semi-insulating GaN layer 230 and the thermal conductive substrate 320, and functions to connect the semi-insulating GaN layer 230 and the thermal conductive substrate 320. The junction layer 310 may include gold-tin (AuSn), but there is no limitation thereto, and accordingly may include all materials enabling the thermal conductive substrate 320 to be connected to the semi-insulating GaN layer 230. Additionally, the thermal conductive substrate 320 may include Si, Al—Si, or metal, but there is no limitation thereto.

An undoped GaN layer 250, a $Si_xC_{1-x}N$ functional layer 260, a first $SiN_x$ layer 270, and a second $SiN_x$ layer 280 are sequentially formed on the AlGaN layer 240.

The nitride-based semiconductor device 200' includes a trench 231 that is formed by etching a portion of the semi-insulating GaN layer 230, the AlGaN layer 240, the undoped GaN layer 250, the $Si_xC_{1-x}N$ functional layer 260, the first $SiN_x$ layer 270, and the second $SiN_x$ layer 280. A 2-DEG layer 241 formed in the AlGaN layer 240 is divided by the trench 231. Since the trench 231 prevents the 2-DEG layer 241 from being formed in a gate area, the nitride-based semiconductor device 200' may easily perform a normally-off type operation.

A gate insulating layer 291, a gate electrode 292, an ohmic metal layer 293, a source electrode 294, a drain electrode 295, and passivation layers 290 in the nitride-based semiconductor device 200' of FIG. 3 are the same as those in the nitride-based semiconductor device 200 of FIG. 2.

The nitride-based semiconductor devices 100, 200, and 200' shown in FIGS. 1 through 3 may be applied to various types of electronic devices. The HFET, to which the nitride-based semiconductor devices 100, 200, and 200' are applied, has been described with reference to FIGS. 1 through 3, but there is no limitation thereto. For example, a nitride-based semiconductor device according to an embodiment of the present inventive concept may also be applied to a Schottky bather diode (SBD).

Figure 4:
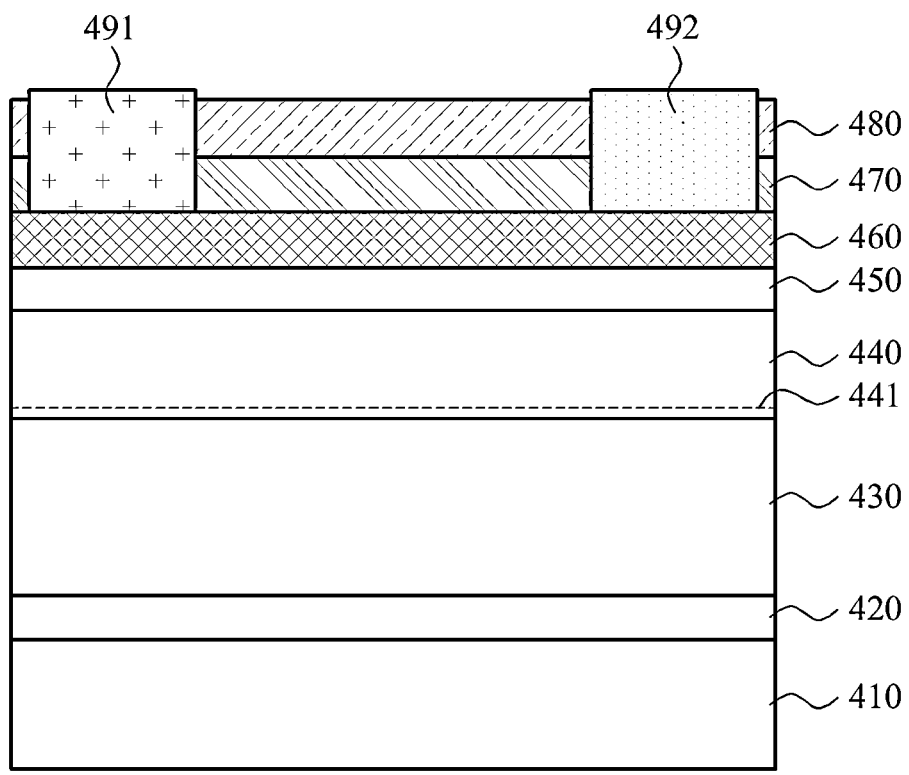
FIG. 4 is a cross-sectional diagram illustrating a structure of a nitride-based semiconductor device according to yet another embodiment of the present inventive concept.
Figure 5:
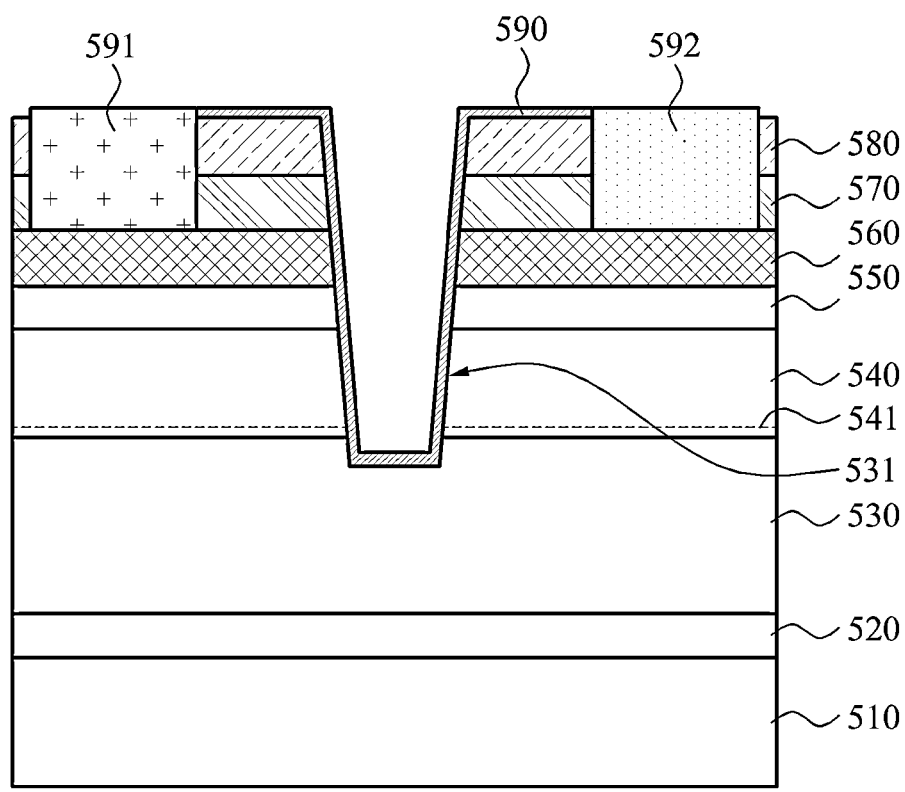
FIG. 5 is a cross-sectional diagram illustrating a structure of a nitride-based semiconductor device according to a further embodiment of the present inventive concept.
Figure 6:
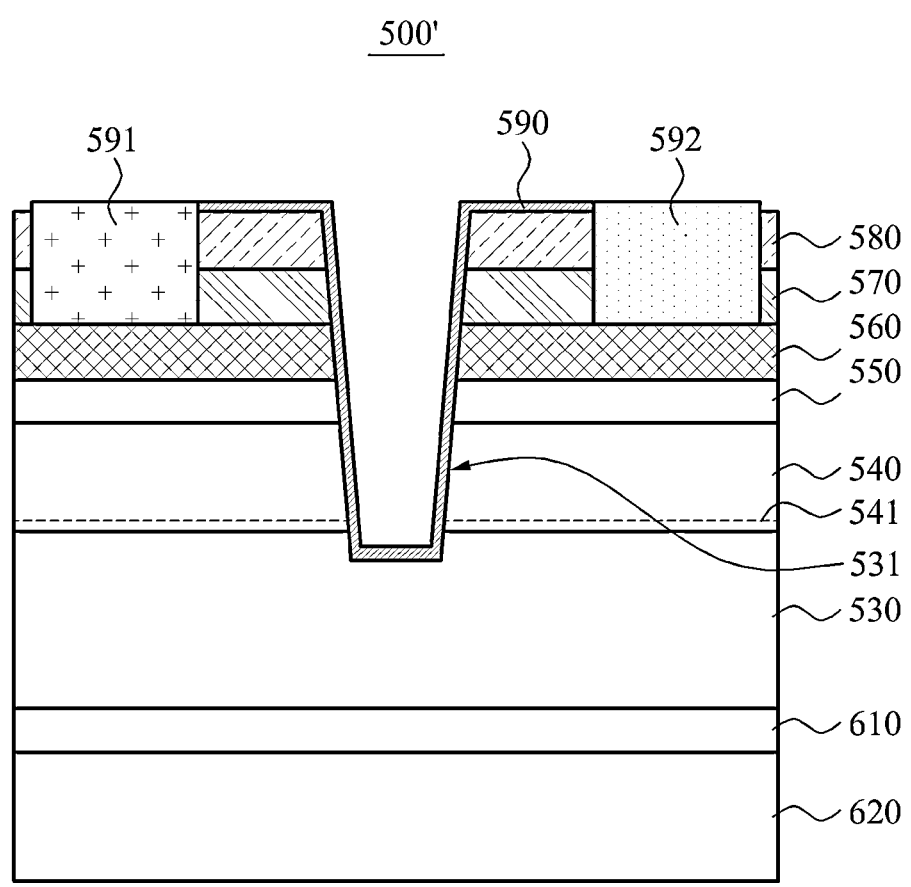
FIG. 6 is a cross-sectional diagram illustrating a structure of a nitride-based semiconductor device according to a further embodiment of the present inventive concept.

FIGS. 4 through 6 illustrate nitride-based semiconductor devices 400, 500 and 500' according to embodiments of the present inventive concept. The nitride-based semiconductor devices 400, 500 and 500' may correspond to SBDs.

The nitride-based semiconductor device 400 of FIG. 4 includes a substrate 410, a semi-insulating GaN layer 430 formed on the substrate 410, an AlGaN layer 440 formed on the semi-insulating GaN layer 430, an undoped GaN layer 450 formed on the AlGaN layer 440, a $Si_xC_{1-x}N$ functional layer 460 formed on the undoped GaN layer 450, and a first $SiN_x$ layer 470 formed on the $Si_xC_{1-x}N$ functional layer 460.

Additionally, the nitride-based semiconductor device 400 may further include a buffer layer 420 formed between the substrate 410 and the semi-insulating GaN layer 430. The buffer layer 420 may be, for example, a low temperature SiC layer or a GaN layer.

A 2-DEG layer 441 may be formed in the AlGaN layer 440 due to a difference in band-gap energy between the AlGaN layer 440 and the undoped GaN layer 450.

An ohmic electrode 491 is formed on a first area of the $Si_xC_{1-x}N$ functional layer 460, and may be formed of a material selected from the group consisting of chromium (Cr), Al, Ta, Ti, Au, Ni, and Pt.

A Schottky electrode 492 is formed on a second area of the $Si_xC_{1-x}N$ functional layer 460, and may be formed of a material selected from the group consisting of Ni, Au, copper indium oxide ($CuInO_2$), indium tin oxide (ITO) and Pt, and alloys thereof. Alloys may include, for example, an alloy of Ni and Au, an alloy of $CuInO_2$ and Au, an alloy of ITO and Au, an alloy of Ni, Pt, and Au, and an alloy of Pt and Au, but there is no limitation thereto.

Hereinafter, a method of manufacturing the nitride-based semiconductor device 400 will be described briefly.

The method of manufacturing the nitride-based semiconductor device 400 includes forming the semi-insulating GaN layer 430 on the substrate 410, forming the AlGaN layer 440 on the semi-insulating GaN layer 430, forming the undoped GaN layer 450 on the AlGaN layer 440, forming the $Si_xC_{1-x}N$ functional layer 460 on the undoped GaN layer 450, and forming the first $SiN_x$ layer 470 on the $Si_xC_{1-x}N$ functional layer 460.

First, the buffer layer 420 may be formed on the substrate 410. The buffer layer 420 may include a complex of $Si_xC_{1-x}N$ and GaN, or may be, for example, a low temperature-SiC layer or a GaN layer. The buffer layer 420 enhances stability of an HFET by minimizing a difference in a thermal expansion coefficient, a lattice constant and the like of a nitride-based semiconductor layer, such as the semi-insulating GaN layer 430 and the AlGaN layer 440.

The semi-insulating GaN layer 430 may be formed on the buffer layer 420. The semi-insulating GaN layer 430 prevents leakage current from flowing toward the substrate 410, and has a relatively high resistance for separation of devices. The semi-insulating GaN layer 430 may exhibit semi-insulating properties due to an extremely high resistance.

Subsequently, the AlGaN layer 440 is formed on the semi-insulating GaN layer 430, and may act as a channel layer. The undoped GaN layer 450 is formed on the AlGaN layer 440, and prevents current from leaking from a surface of the AlGaN layer 440.

The buffer layer 420, the semi-insulating GaN layer 430, the AlGaN layer 440, and the undoped GaN layer 450 may be formed using methods, for example, metal organic chemical vapor deposition (MOCVD), molecular beam epitaxy (MBE), hydride vapor phase epitaxy (HYPE), and the like, but the methods are not limited thereto.

Subsequently, the $Si_xC_{1-x}N$ functional layer 460 is formed on the undoped GaN layer 450, by various deposition methods, for example, plasma enhanced chemical vapor deposition (PECVD), and the like. For example, the $Si_xC_{1-x}N$ functional layer 460 may be formed through an in-situ process by MOCVD.

To form the $Si_xC_{1-x}N$ functional layer 460 by MOCVD, tetrabromomethane ($CBr_4$) may be used as a source of C, ditertiarybutyl silane (DTBSi) may be used as a source of Si, and ammonia ($NH_3$) may be used as a source of N. The $Si_xC_{1-x}N$ functional layer 460 may be formed through an in-situ process after the AlGaN layer 440 and the undoped GaN layer 450 are formed by MOCVD. Thus, a manufacturing efficiency of the nitride-based semiconductor device 400 may be increased.

Subsequently, a second $SiN_x$ layer 480 is formed on the first $SiN_x$ layer 470. The second $SiN_x$ layer 480 may be formed by a process using a low pressure chemical vapor deposition (LPCVD).

For example, the second $SiN_x$ layer 480 may be formed as a protective film on the $Si_xC_{1-x}N$ functional layer 460, by using LPCVD. Therefore, a nitride-based surface is protected, and accordingly a part having an influence on the nitride-based surface during a process is blocked. Thus, it is possible to reduce leakage current, and to manufacture a device with ensured reliability.

Subsequently, a portion of the first $SiN_x$ layer 470 and a portion of the second $SiN_x$ layer 480 may be etched using a photoresist process, and then the ohmic electrode 491 and the Schottky electrode 492 may be formed on the $Si_xC_{1-x}N$ functional layer 460.

Operations other than an operation of forming the ohmic electrode 491 and the Schottky electrode 492 in the above-described method may equally be applied to the nitride-based semiconductor devices 100, 200, 200' shown in FIGS. 1 through 3.

FIG. 5 is a cross-sectional diagram illustrating a structure of the nitride-based semiconductor device 500.

Referring to FIG. 5, the nitride-based semiconductor device 500 includes a substrate 510, a semi-insulating GaN layer 530 formed on the substrate 510, an AlGaN layer 540 formed on the semi-insulating GaN layer 530, an undoped GaN layer 550 formed on the AlGaN layer 540, a $Si_xC_{1-x}N$ functional layer 560 formed on the undoped GaN layer 550, and a first $SiN_x$ layer 570 formed on the $Si_xC_{1-x}N$ functional layer 560.

Additionally, the nitride-based semiconductor device 500 may further include a buffer layer 520 formed between the substrate 510 and the semi-insulating GaN layer 530. The buffer layer 520 may be, for example, a low temperature SiC layer or a GaN layer.

The semi-insulating GaN layer 530 is exposed by a trench 531. Specifically, the trench 531 is formed by etching a portion of the semi-insulating GaN layer 530, the AlGaN layer 540, the undoped GaN layer 550, the $Si_xC_{1-x}N$ functional layer 560, and the first $SiN_x$ layer 570.

An insulating layer 590 may be formed along an inner surface of the trench 531. When a second $SiN_x$ layer 580 is formed on the first $SiN_x$ layer 570, as shown in FIG. 5, the insulating layer 590 may extend to an upper area of the second $SiN_x$ layer 580, along the inner surface of the trench 531.

A 2-DEG layer 541 may be formed in the AlGaN layer 540. The 2-DEG layer 541 is formed due to a difference in band-gap energy between the AlGaN layer 540 and the undoped GaN layer 550. The 2-DEG layer 541 acts as a channel layer enabling current to flow.

In FIG. 5, the 2-DEG layer 541 formed in the AlGaN layer 540 is divided by the trench 531.

To form an ohmic electrode 591 and a Schottky electrode 592, a first area and a second area of the $Si_xC_{1-x}N$ functional layer 560 are exposed. The first area and the second area may be exposed by etching a portion of the first $SiN_x$ layer 570 and a portion of the second $SiN_x$ layer 580.

The ohmic electrode 591 and the Schottky electrode 592 are formed on the first area and the second area of the $Si_xC_{1-x}N$ functional layer 560, respectively.

FIG. 6 is a cross-sectional diagram illustrating a structure of the nitride-based semiconductor device 500'. The nitride-based semiconductor device 500' of FIG. 6 is configured by changing a portion of the structure of the nitride-based semiconductor device 500 of FIG. 5.

Specifically, the nitride-based semiconductor device 500' includes a junction layer 610 and a thermal conductive substrate 620, instead of including a substrate and a buffer layer, in comparison to the nitride-based semiconductor device 500. The nitride-based semiconductor device 500' is implemented by removing the substrate 510 and the buffer layer 520 from the nitride-based semiconductor device 500 through a laser lift-off process, and by connecting a semi-insulating GaN layer 530 to the thermal conductive substrate 620 using the junction layer 610.

Accordingly, the semi-insulating GaN layer 530, a trench 531, an AlGaN layer 540, a 2-DEG layer 541, an undoped GaN layer 550, a $Si_xC_{1-x}N$ functional layer 560, a first $SiN_x$ layer 570, a second $SiN_x$ layer 580, an insulating layer 590, an ohmic electrode 591, and a Schottky electrode 592 in the nitride-based semiconductor device 500' may have the same structure and perform the same function as those in the nitride-based semiconductor device 500 of FIG. 5, except for the junction layer 610 and the thermal conductive substrate 620.

Hereinafter, properties of a nitride-based semiconductor device including a $Si_xC_{1-x}N$ functional layer generated according to an embodiment of the present inventive concept will be described in detail with reference to FIGS. 7A through 8B, by comparing the properties of the nitride-based semiconductor device according to an embodiment of the present inventive concept with properties of a conventional nitride-based semiconductor device without a $Si_xC_{1-x}N$ functional layer.

Figure 7A:
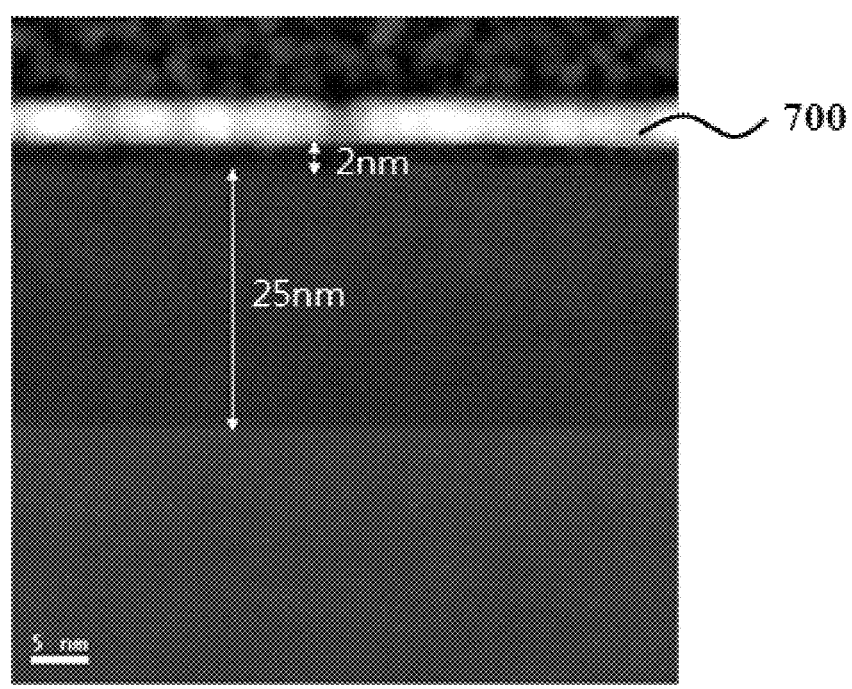
FIG. 7A is a transmission electron microscope (TEM) photograph of a portion of a nitride-based semiconductor device according to an embodiment of the present inventive concept.
Figure 7B:
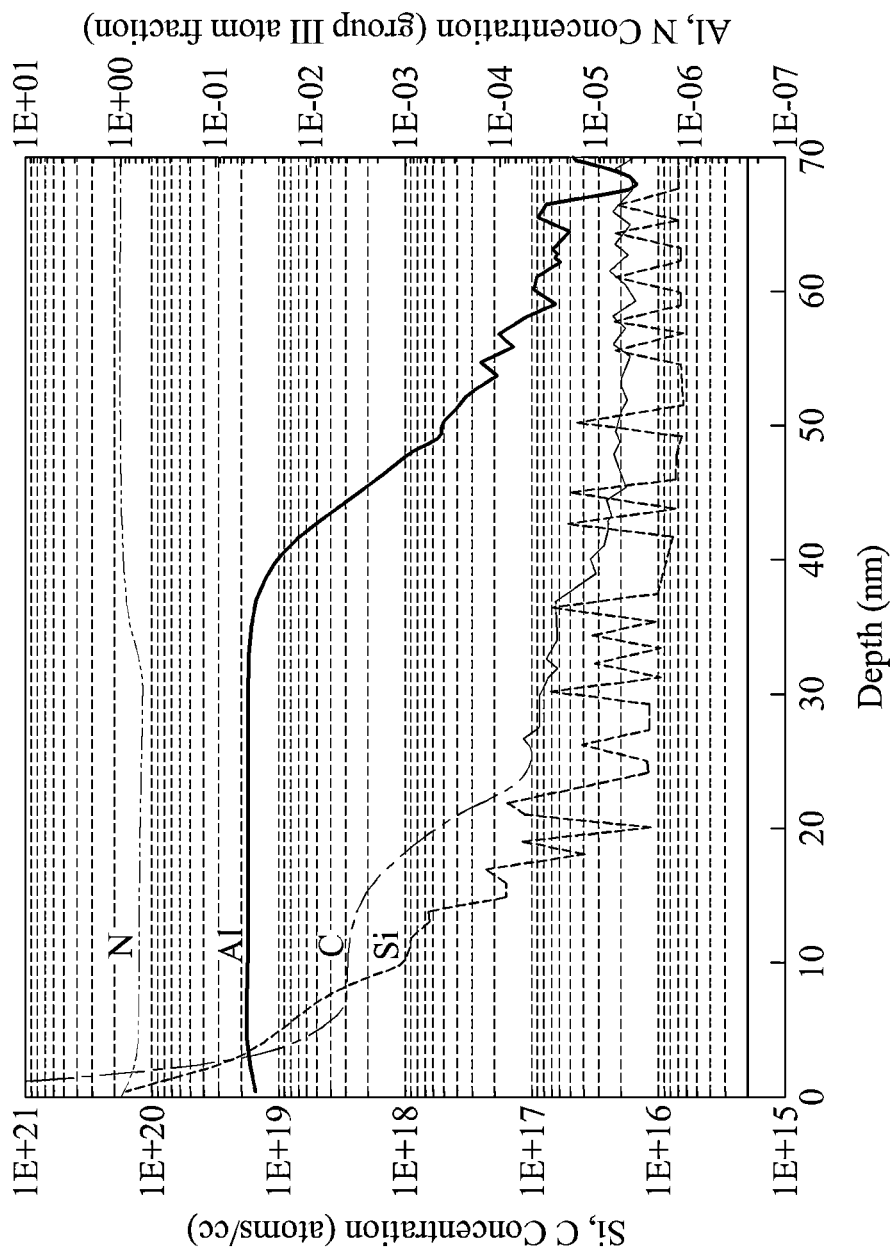
FIG. 7B is a graph illustrating data obtained by measuring an atomic composition at a depth ranging up to about 60 nanometers (nm) by applying secondary ion mass spectrometry (SIMS) to a portion of a nitride-based semiconductor device according to an embodiment of the present inventive concept.

FIG. 7A is a transmission electron microscope (TEM) photograph of a portion of a nitride-based semiconductor device according to an embodiment of the present inventive concept. FIG. 7B is a graph illustrating data obtained by measuring an atomic composition at a depth ranging up to about 60 nm by applying secondary ion mass spectrometry (SIMS) to a portion of a nitride-based semiconductor device according to an embodiment of the present inventive concept.

As shown in FIG. 7A, it can be seen that a $SiC_{1-x}N$ functional layer 700 was grown to a thickness of about 2 nm on a barrier layer having a thickness of about 25 nm. As shown in FIG. 7B, it can be seen that Si, C, and nitrogen (N) are included in the $SiC_{1-x}N$ functional layer 700, and that Al is included in the barrier layer.

Figure 8A:
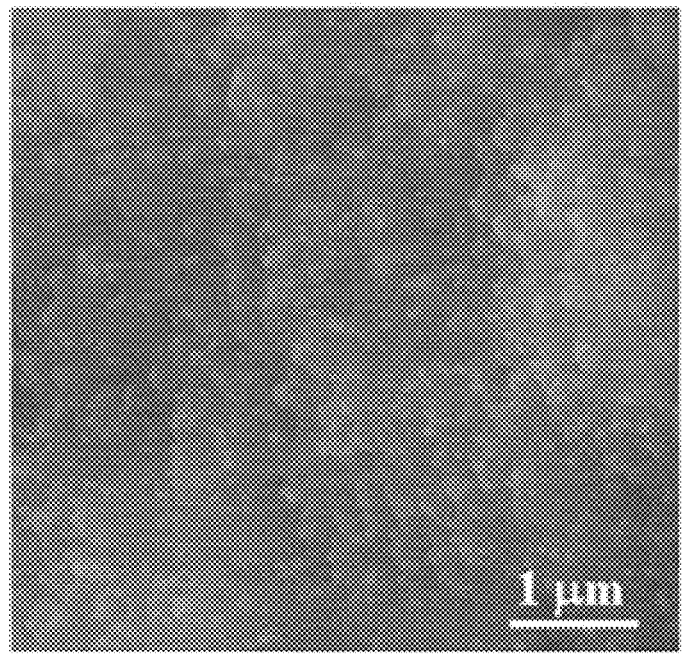
FIG. 8A is an atomic force microscope (AFM) photograph of a surface of a barrier layer in a conventional nitride-based semiconductor device without a silicon carbon nitride ($SiC_{1-x}N$) functional layer.
Figure 8B:
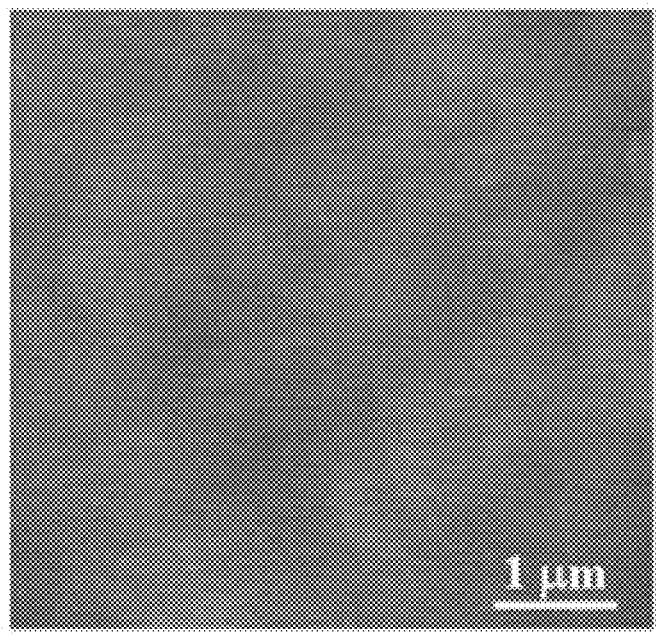
FIG. 8B is an AFM photograph of a surface of a bather layer in a nitride-based semiconductor device including a $SiC_{1-x}N$ functional layer according to an embodiment of the present inventive concept.

FIG. 8A is an atomic force microscope (AFM) photograph of a surface of a barrier layer in a conventional nitride-based semiconductor device without a $SiC_{1-x}N$ functional layer. FIG. 8B is an AFM photograph of a surface of a barrier layer in a nitride-based semiconductor device including a $SiC_{1-x}N$ functional layer according to an embodiment of the present inventive concept.

As shown in FIG. 8A, when a $SiC_{1-x}N$ functional layer was not included, the surface roughness of the barrier layer was about 0.7 nm. As shown in FIG. 8B, when the $SiC_{1-x}N$ functional layer was included, the surface roughness of the barrier layer was about 0.44 nm. Accordingly, it can be seen that the surface roughness decreased when the $SiC_{1-x}N$ functional layer was included. Due to a reduction in the surface roughness of the barrier layer, an electric charge on the surface of the barrier layer may be protected.

Additionally, when the $SiC_{1-x}N$ functional layer was not included, a 2-DEG mobility measured by a Hall measurement was about 1500 centimeters squared per volt-second ($cm^2$/Vs), and a sheet carrier density was about $8\times10^{12}$ per square centimeter ($/cm^2$). On the other hand, when the $SiC_{1-x}N$ functional layer of about 2 nm thickness was included, the 2-DEG mobility decreased to about 1300 $cm^2/Vs$, and the sheet carrier density increased to about $1\times10^{13}/cm^2$. In other words, when the $Si_xC_{1-x}N$ functional layer is included, the 2-DEG mobility may be reduced, since scattering may be readily performed due to a greater number of electrons existing on the surface of the barrier layer with improved crystallinity.

According to embodiments of the present inventive concept, in a nitride-based semiconductor device, an undoped GaN layer may be formed on an AlGaN layer, and a $Si_xC_{1-x}N$ functional layer may be formed on the undoped GaN layer. Thus, it is possible to improve a surface roughness of the AlGaN layer, and to reduce surface leakage current by inhibiting Al and O from combining with each other on a surface of the AlGaN layer.

Additionally, in comparison to a structure in which an AlGaN layer is in direct contact with an electrode, a structure according to embodiments of the present inventive concept in which a $Si_xC_{1-x}N$ functional layer is formed between an AlGaN layer and an electrode may have a low barrier. However, in the structure according to embodiments of the present inventive concept, it is possible to increase a current density by lowering operating voltage.

In addition, according to embodiments of the present inventive concept, in a method of manufacturing a nitride-based semiconductor device, an in-situ process by MOCVD may be used to form a $Si_xC_{1-x}N$ functional layer, and the $Si_xC_{1-x}N$ functional layer may be grown using $CBr_4$ as a source of C, using DTBSi as a source of Si, and using $NH_3$ as a source of N. Thus, it is possible to improve a surface roughness of the AlGaN layer.

Furthermore, a second $SiN_x$ layer may be formed as a protective film on a $Si_xC_{1-x}N$ functional layer, by using LPCVD. Therefore, a nitride-based surface may be protected, and accordingly a part having an influence on the nitride-based surface during a process may be blocked. Thus, it is possible to reduce leakage current, and to manufacture a device with ensured reliability.

Although a few exemplary embodiments of the present inventive concept have been shown and described, the present inventive concept is not limited to the described exemplary embodiments. Instead, it would be appreciated by those skilled in the art that changes may be made to these exemplary embodiments without departing from the principles and spirit of the present inventive concept, the scope of which is defined by the claims and their equivalents.

What is claimed is:

1. A nitride-based semiconductor device, comprising:
    a substrate;
    a semi-insulating gallium nitride (GaN) layer disposed on the substrate;
    an aluminum gallium nitride (AlGaN) layer disposed on the semi-insulating GaN layer;
    an undoped GaN layer disposed on the AlGaN layer;
    a silicon carbon nitride ($Si_xC_{1-x}N$) functional layer disposed on and in direct physical contact with the undoped GaN layer;
    a first silicon nitride ($SiN_x$) layer disposed on the $Si_xC_{1-x}N$ functional layer; and
    at least two electrodes disposed on and in direct physical contact with the $SiC_{1-x}N$ functional layer,
    wherein an upper surface of the $SiC_{1-x}N$ functional layer is entirely covered with the first $SiN_x$ layer and the at least two electrodes.

2. The nitride-based semiconductor device of claim 1, further comprising:
    a low temperature silicon carbide (SiC) layer or a GaN layer disposed between the substrate and the semi-insulating GaN layer.

3. The nitride-based semiconductor device of claim 1, further comprising:
    a second $SiN_x$ layer disposed on the first $SiN_x$ layer.

4. The nitride-based semiconductor device of claim 3, wherein the second $SiN_x$ layer has a thickness of 1 nm to 500 nm.

5. The nitride-based semiconductor device of claim 3, wherein the AlGaN layer comprises a two-dimensional electron gas (2DEG) layer disposed in the AlGaN layer.

6. The nitride-based semiconductor device of claim 5, further comprising;
    a gate electrode disposed on the second $SiN_x$ layer, and
    wherein the at least two electrodes comprise a source electrode spaced apart on the $Si_xC_{1-x}N$ functional layer.

7. The nitride-based semiconductor device of claim 5, further comprising:

an ohmic electrode disposed on the $Si_xC_{1-x}N$ functional layer, the ohmic electrode being exposed through a first area of the $Si_xC_{1-x}N$ functional layer; and a Schottky electrode disposed on the $Si_xC_{1-x}N$ functional layer, the Schottky electrode being exposed through a second area of the $Si_xC_{1-x}N$ functional layer.

8. The nitride-based semiconductor device of claim 5, wherein the semi-insulating GaN layer is exposed by a trench extending along a portion of the semi-insulating GaN layer, the AlGaN layer, the undoped GaN layer, the $Si_xC_{1-x}N$ functional layer, and the first $SiN_x$ layer.

9. The nitride-based semiconductor device of claim 8, further comprising:
an insulating layer disposed along an inner surface of the trench.

10. The nitride-based semiconductor device of claim 9, further comprising:
a gate electrode disposed on a gate insulating layer;
a source electrode disposed on the $Si_xC_{1-x}N$ functional layer, the source electrode being exposed through a first area of the $Si_xC_{1-x}N$ functional layer; and
a drain electrode disposed on the $Si_xC_{1-x}N$ functional layer, the drain electrode being exposed through a second area of the $Si_xC_{1-x}N$ functional layer,
wherein the insulating layer corresponds to the gate insulating layer.

11. The nitride-based semiconductor device of claim 9, further comprising:
an ohmic electrode disposed on the $Si_xC_{1-x}N$ functional layer, the ohmic electrode being exposed through a first area of the $Si_xC_{1-x}N$ functional layer; and
a Schottky electrode disposed on the $Si_xC_{1-x}N$ functional layer, the Schottky electrode being exposed through a second area of the $Si_xC_{1-x}N$ functional layer.

12. The nitride-based semiconductor device of claim 1, wherein x in the $Si_xC_{1-x}N$ functional layer has a value in a range of $0<x<1$.

13. The nitride-based semiconductor device of claim 1, wherein the $Si_xC_{1-x}N$ functional layer comprises monocrystalline $Si_xC_{1-x}N$, polycrystalline $Si_xC_{1-x}N$, or amorphous $Si_xC_{1-x}N$.

14. The nitride-based semiconductor device of claim 1, wherein the $Si_xC_{1-x}N$ functional layer has a thickness of 1 nm to 50 nm.

15. The nitride-based semiconductor device of claim 1, wherein the undoped GaN layer has a thickness of 1 nm to 50 nm.

16. The nitride-based semiconductor device of claim 1, wherein the first $SiN_x$ layer has a thickness of 1 nm to 50 nm.

17. A method of manufacturing a nitride-based semiconductor device, the method comprising:
forming a semi-insulating gallium nitride (GaN) layer on a substrate;
forming an aluminum gallium nitride (AlGaN) layer on the semi-insulating GaN layer;
forming an undoped GaN layer on the AlGaN layer;
forming a silicon carbon nitride ($Si_xC_{1-x}N$) functional layer on and in direct physical contact with the undoped GaN layer;
forming a first silicon nitride ($SiN_x$) layer on the $Si_xC_{1-x}N$ functional layer; and
forming at least two electrodes disposed on and in direct physical contact with the $SiC_{1-x}N$ functional layer,
wherein an upper surface of the $SiC_{1-x}N$ functional layer is entirely covered with the first $SiN_x$ layer and the at least two electrodes.

18. The method of claim 17, wherein the forming of the $Si_xC_{1-x}N$ functional layer comprises using tetrabromomethane ($CBr_4$) as a source of carbon (C), using ditertiarybutyl silane (DTBSi) as a source of silicon (Si), and using ammonia ($NH_3$) as a source of nitrogen (N).

19. The method of claim 17, wherein the $Si_xC_{1-x}N$ functional layer and the first $SiN_x$ layer are formed through an in-situ process by metal organic chemical vapor deposition (MOCVD).

20. The method of claim 17, further comprising:
forming a second $SiN_x$ layer on the first $SiN_x$ layer,
wherein the second $SiN_x$ layer is formed by using low pressure chemical vapor deposition (LPCVD).

\* \* \* \* \*